United States Patent [19]
Laukien

[11] Patent Number: 5,160,888
[45] Date of Patent: Nov. 3, 1992

[54] METHOD AND APPARATUS FOR ONE SIDED MAGNETIC RESONANCE IMAGING

[75] Inventor: Dirk D. Laukien, Lexington, Mass.

[73] Assignee: Bruker Instruments, Inc., Billerica, Mass.

[21] Appl. No.: 693,323

[22] Filed: Apr. 29, 1991

[51] Int. Cl.[5] .................................................. G01R 33/20
[52] U.S. Cl. .................................................. 324/309
[58] Field of Search ............... 324/300, 307, 308, 309, 324/310, 311, 312, 313, 314, 318, 322; 128/653 SC, 653 A

[56] References Cited

U.S. PATENT DOCUMENTS 4,354,499 10/1982 Damadian ........................... 324/309
4,901,019 2/1990 Wedeen ............................... 324/309

FOREIGN PATENT DOCUMENTS 140955 9/1987 European Pat. Off.
3690746 7/1986 Fed. Rep. of Germany.

OTHER PUBLICATIONS

"Hydroscope Geological NMR-Tomograph", Siberian Branch of the USSR Academy of Sciences.

Primary Examiner—Michael J. Tokar
Attorney, Agent, or Firm—Wolf, Greenfield & Sacks

[57] ABSTRACT

The invention is a method and apparatus for performing high speed, high resolution nuclear magnetic resonance imaging wherein the magnetic coils for inducing the desired magnetic fields and receiving the magnetic field caused by NMR are positioned to one side of the volume under observation. Disclosed coil configurations provide a relatively large volume homogenous Ho field and three orthogonal gradient fields, so as to create a relatively large volume of observation which is broken up into high resolution voxels by appropriate selection of each of the gradient fields. The voxel is shifted in space at time intervals by scaling one or more of the gradient fields at such time intervals.

29 Claims, 6 Drawing Sheets

METHOD AND APPARATUS FOR ONE SIDED MAGNETIC RESONANCE IMAGING

FIELD OF THE INVENTION

The invention pertains to a method and apparatus for magnetic resonance imaging where the placement of the coils for generating the required magnetic fields is restricted. More particularly, the invention pertains to a method and apparatus for inducing nuclear magnetic resonance in a geological formation and producing a high resolution image of the geological formation.

BACKGROUND OF THE INVENTION

Nuclear magnetic resonance (NMR) is a phenomenon exhibited by a select group of atomic nuclei and is based upon the existence of nuclear magnetic moments in these nuclei (termed NMR active nuclei). Not all atomic types have NMR active nuclei but some common gyromagnetic nuclei include $^1H$ (protons), $^{13}C$ (carbon 13), $^{19}F$ and $^{31}P$. When such NMR active nuclei are placed in a strong, uniform and steady magnetic field (a so called "Zeeman field", commonly referred to as an Ho field), they precess about the Ho field direction at a natural resonance frequency known as the Larmor frequency. Accordingly, there is a net magnetization along the Ho field direction, however, no net magnetization transverse to the Ho field. An excitation of the nuclei by a magnetic field transverse to the Ho field direction results in a net rotation of the field magnetization into the XY plane. The excitation of the spins can be accomplished by application of weak RF pulses, continuous wave excitation (CW), adiabatic pulses or DC pulses. Each different type of NMR active nucleus has a characteristic Larmor frequency which is dependent on the strength of the applied magnetic field.

Typically, the material under study is placed within a magnetic coil which generates the uniform Zeeman field. An RF coil for generating a field perpendicular to the Zeeman field direction is commonly used to generate the spin excitation fields. After the spins are excited, the spin excitation field is switched off. The excited spins continue for a certain period after the excitation field is switched off as they "relax" back to equilibrium. As the spins are relaxing, there is a detectable net magnetization in the transverse plane. Since the spin excitation field is off during detection of the NMR field, the same RF coil may then be used to detect the resultant NMR field. The magnitude of the NMR field is a function of the density of the excited nuclei in the volume under observation, commonly called spin density.

As discussed above, the resonant frequency of a nucleus is a direct function of the strength of the Ho magnetic field at that nucleus. Accordingly, if the net magnetic field in the volume of interest is spatially variant (e.g., a magnetic field gradient) as opposed to uniform, the resonant frequency at different spatial locations in the volume under observation will differ. Since the resonant frequency of each nucleus will depend on the strength of the field at the location of that nucleus, the frequency spectrum of the induced NMR conveys information as to the relative concentration of the observed nuclei at different spatial locations in the volume under observation. The variation in Larmor frequency from one type of nucleus to another is generally on the order of tens of MHz. Accordingly, NMR of different nuclei type are easily distinguished and one may easily detect NMR spin density of only one type of nuclei during any given observation.

A Fourier transformation of the detected NMR signal from a sample volume in a linearly gradient field provides direct information about the spatial distribution of the NMR active nuclei along the gradient.

Nuclear magnetic resonance imaging has found significant application in the medical field, and in particular, in observing the human body. Reference is made to Morris, Peter G., *Nuclear Magnetic Resonance Imaging in Medicine and Biology*, Clarendon Press, Oxford, 1986, for a detailed description of the use of nuclear magnetic resonance imaging in the medical and biological fields. That publication is incorporated herein by reference.

As stated, NMR imaging has traditionally been accomplished by surrounding the object under observation with magnetic coils for generating the Zeeman, RF, and gradient magnetic fields. However, a variety of applications exist where NMR imaging is desirable but physical constraints exist on the placement of the coils relative to the object to be studied. In some such situations, it is useful to be able to generate the magnetic fields for NMR imaging from coils positioned to one side of the object under observation. For example, in geological applications, i.e., where the volume under observation is underground, it is necessary to induce magnetic fields underground. However, there is a planar boundary, the surface of the ground, which separates the volume to be observed and the region where the coils may be placed.

German patent DE 3690746 C2 discloses an NMR imaging apparatus for "visualizing" subterranean water. The apparatus is an NMR hydroscope in which spatial resolution is given only by the spatial extent of the RF field. Accordingly, in order to obtain spatial resolution, the entire apparatus must be moved. Detection of the NMR signals is made by a loop placed on the earth's surface. Information about the depth of the received signal is calculated from the change in signal amplitude and time characteristics. However, information about points shifted in the horizontal plane can only be obtained by moving the entire apparatus horizontally on the surface. The apparatus has no resolution in the horizontal plane and only limited resolution along the vertical axis.

Accordingly, it is an object of the present invention to provide a method and apparatus for performing nuclear magnetic resonance imaging of a volume of observation from one side of the sample volume.

It is another object of the present invention to provide a method and apparatus for performing nuclear magnetic resonance imaging in geological applications.

It is a further object of the present invention to provide a method and apparatus for performing nuclear magnetic resonance imaging of the earth removed to one side of the apparatus.

It is yet another object of the present invention to provide a unique magnetic coil configuration for inducing the necessary magnetic fields for high resolution NMR imaging to one side of the coil arrangement.

It is yet a further object of the present invention to provide a high resolution NMR imaging technique that can be used to map out large volumes without the need to move the magnetic coils.

It is a further object of the present invention to provide a nuclear magnetic resonance imaging technique which can detect nuclear magnetic resonances over 20 meters from the receiver coils.

It is another object of the present invention to provide a high speed method and apparatus for nuclear magnetic resonance imaging from one side of the volume under observation.

It is yet a further object of the present invention to provide a method and apparatus for nuclear magnetic resonance imaging in the earth wherein a high resolution image of the volume under observation can be obtained without movement of the magnetic coils.

SUMMARY OF THE INVENTION

The invention comprises a method and apparatus for performing "one-sided" NMR imaging. The apparatus is capable of generating the necessary magnetic fields for NMR imaging in a sample volume to one side of the coil configuration (e.g., underground) by use of particular magnetic coil configurations. Coils create an Ho Zeeman field which is uniform over a large volume disposed to one side of the coil configuration (e.g, underground). Magnetic gradient fields in each of the three orthogonal coordinate dimensions, X, Y, Z, are generated by three additional separate coil configurations.

In the preferred embodiment for geological applications, the coil configuration for producing both the Ho field underground and the magnetic gradient in the vertical direction (parallel to the Ho field and hereafter termed the Z dimension) is a pair of concentric annular coils of different radius lying flat on the ground and having current flowing in opposite directions. The two coils for generating the Ho field are driven with a current of a magnitude and characteristic to provide a uniform field in the volume under observation. The two coils for creating the Z gradient are also charged with current flowing in opposite direction to each other, but of a different magnitude than the current driving the Ho Zeeman coils, in order to create a linear gradient in the Z direction as opposed to a uniform field. Preferably, one of the horizontal field gradients (e.g., X gradient) is generated by a coil configuration comprising two pairs of rectangular coils. Each pair comprises a first, larger rectangular coil driven by a current flowing in a first direction and a second, smaller coil positioned within the larger coil driven by a current flowing in the opposite direction. The coils are aligned with their long sides perpendicular to the X axis and lying flat on the ground (i.e., in the X-Y plane). The second pair of square coils is identical to the ones just described and is displaced in the X direction from the first pair. The Y gradient coils are identical to the X gradient coils in structure and placement except their placement is rotated 90° in the X-Y plane. The net magnetic field strength at any location in the volume under observation is the vector sum of the earth's magnetic field and the field produced by the various Zeeman field and gradient field coils.

Transmitter/receiver coils are used to transmit an RF magnetic pulse to excite the spins of the nuclei and then to receive the resultant NMR signal. Due to the fact that the net magnetic field strength in the volume under observation is spatially variant in all three coordinate dimensions, the Larmor frequency of the NMR active nuclei is different a different spatial locations in the volume under observation. Conventional NMR imaging techniques are used to take advantage of the spatially distinct Larmor frequency characteristics and to produce an image from the received magnetic signal. The strength of each gradient field is incremented individually, the spins excited, and the resultant NMR field received as many times as desired to achieve the required resolution.

Since the magnetic coils do not need to be physically moved to shift the gradient fields, a volume of space can be mapped in high resolution relatively quickly.

DETAILED DESCRIPTION OF A PREFERRED EMBODIMENT

Figure 1:
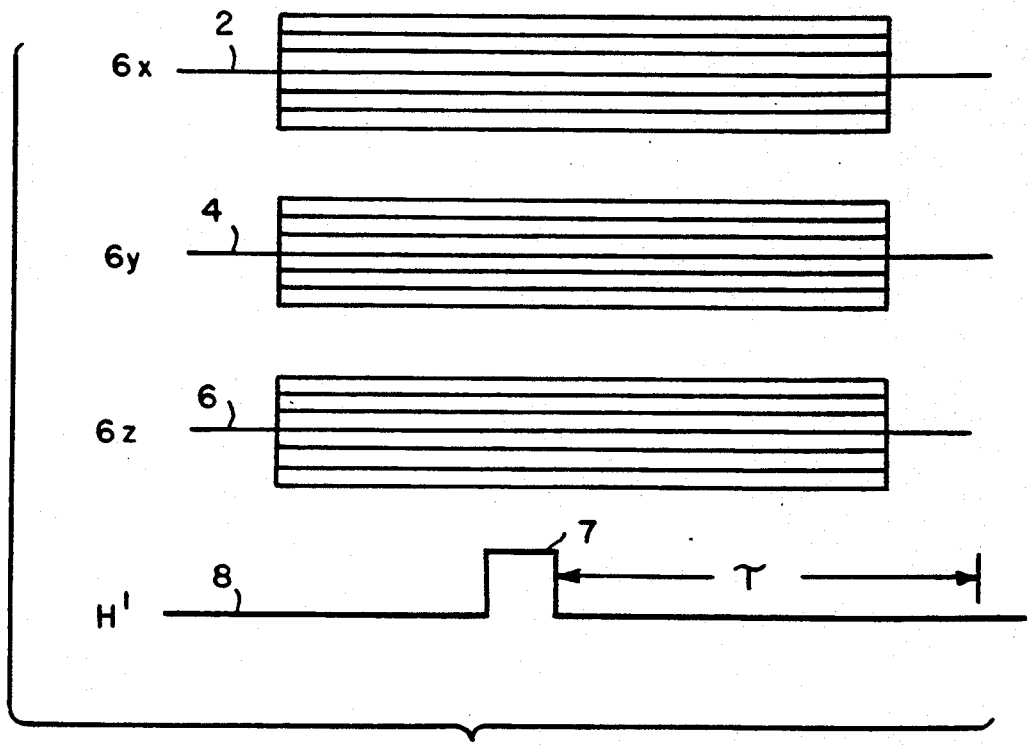
FIG. 1 is a time domain graph partially illustrating the operation of a preferred embodiment of the present invention.

An illustrative method of inducing NMR is shown in FIG. 1. Three orthogonal gradient fields ($G_X$, $G_Y$, $G_Z$, corresponding to the Cartesian coordinates), represented by graphs 2, 4 and 6, respectively, are switched on and allowed to stabilize. The Ho field is not separately shown. Once the Ho field and gradient fields have reached a stable state, the NMR spin system is perturbed by a magnetic pulse 7 in a field transverse to the Ho field, as illustrated at 8 in FIG. 1. The excitation field can be by many means, including hard RF pulses, continuous wave, adiabatic pulses and DC pulses. Following a fixed delay interval, the NMR field induced by the pulse 7 is received by a receiver coil, digitized and stored. The process is continuously repeated with the strength of each of the gradient fields being incremented individually. Once a full three dimensional matrix of data points, e.g., $128 \times 128 \times 128$, is collected, digitized and stored, a Fourier transformation is performed on the data. The Fourier transformation yields a three dimensional image of the spin density of the NMR active nuclei. Other well known NMR imaging techniques may be used also.

FIGS. 2 and 3 illustrate the coil designs of a first preferred embodiment of the present invention. In FIG. 2, the Z axis is perpendicular to the page. In FIG. 3, the Y axis is perpendicular to the page. FIG. 4 illustrates the preferred configuration of the coils relative to one another and the volume under observation in order to produce the desired net magnetic field on one side of the coil configuration. The invention is considered a "one sided" NMR imaging method and apparatus because it generates the necessary magnetic fields for NMR imaging at a location displaced from the coils. The apparatus is useful in applications where there is a roughly planar boundary between the volume it is desired to observe and the location where the magnetic coils can be placed (in the illustrated coordinate system, the XY plane). One example of such a situation is the geological application where the volume of interest is underground, but the coils can only practically be placed on the ground. In this situation, the surface of the earth would constitute the planar boundary between the volume under observation and the coils. As stated previously, it is desired to produce a homogeneous Ho Zeeman field in the volume under observation. The Ho field is constant in time. In order to induce NMR of the desired nuclei, a RF field, DC field, or continuous wave field is generated transverse to the Ho field. The discussion hereafter will assume an RF pulse field, however, it should be understood that any other well known type of NMR exciting fields would also be effective.

Figure 2E:
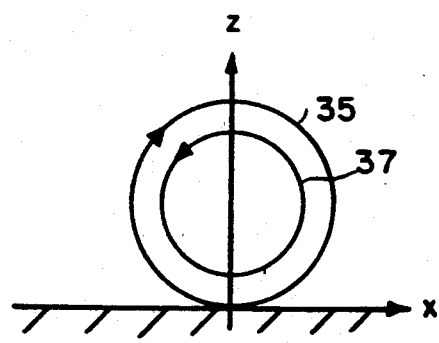
FIGS. 2a-2e are plan views of the various coils utilized in preferred embodiments of the present invention.
Figure 2A:
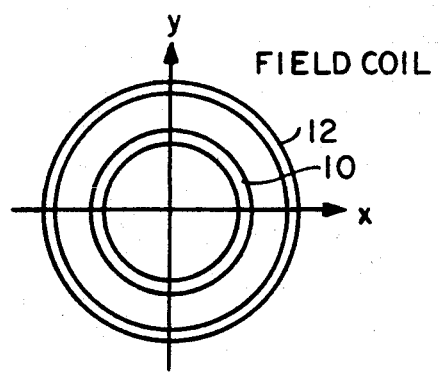
Figure 3A:
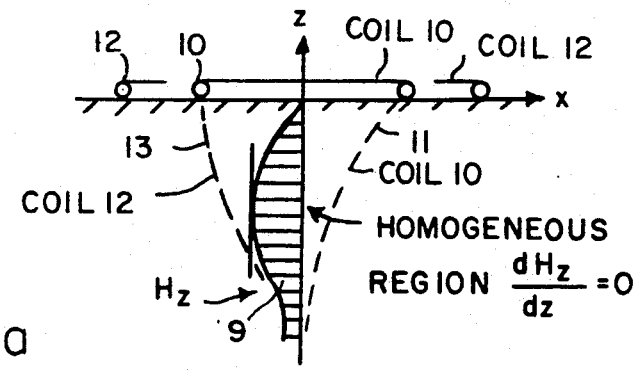
FIGS. 3a-3e are side views of the corresponding coils shown in FIG. 2 superimposed on a magnetic field graph.
Figure 4:
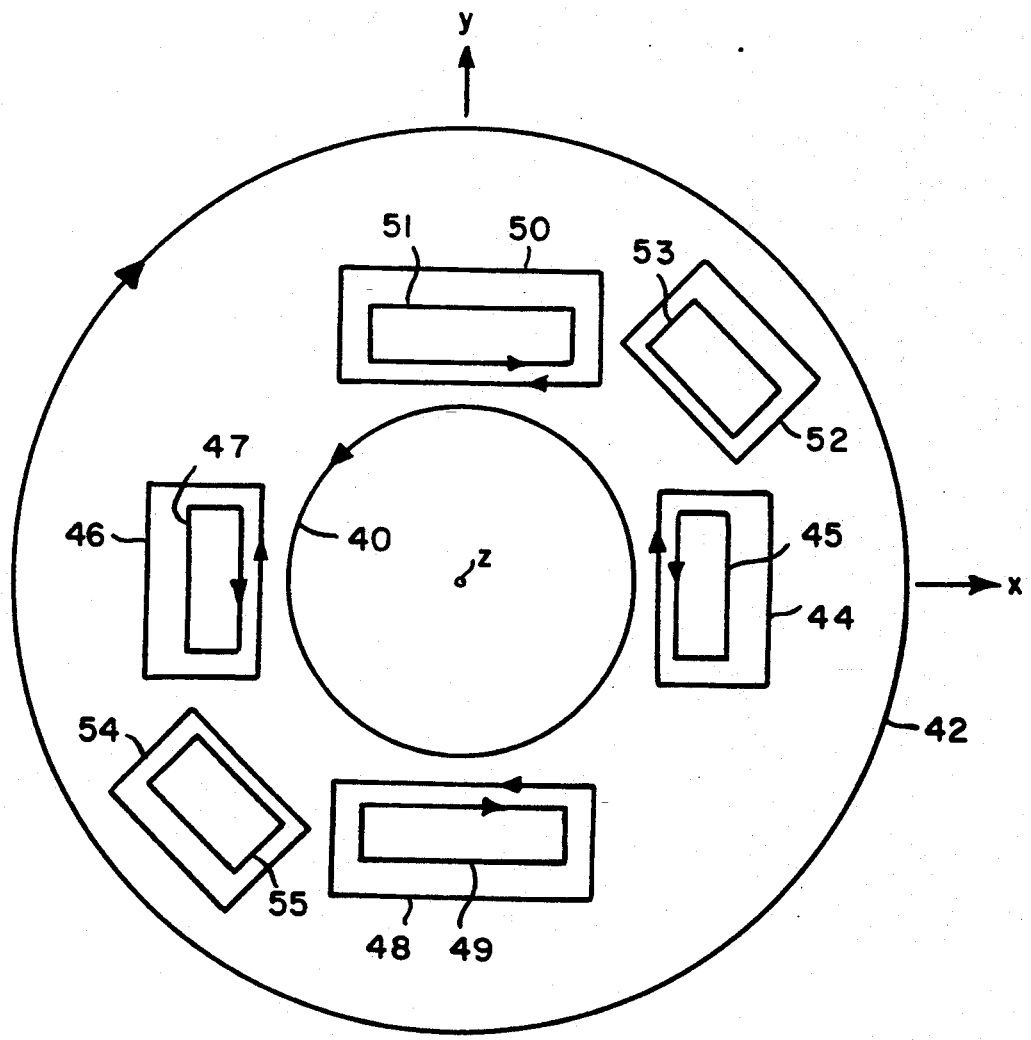
FIG. 4 is a plan view of an overall coil arrangement of the apparatus of a preferred embodiment of the present invention.

The coil configuration shown in FIGS. 2a and 3a show the coil for generating the Ho field. As shown in FIG. 2a, the Ho field coil configuration comprises two concentric annular coils 10 and 12. Coil 10 has a smaller diameter than coil 12. Preferably, each of the coils 10 and 12 is constructed of copper, silver or aluminum. If and when high temperature super conductive materials become available, such materials would also be preferred. Electrical current is applied to each of coils 10 and 12 with the current flowing in opposite directions in the separate coils, i.e., if current flows clockwise in coil 10, then current flows counterclockwise in coil 12. To generate a large homogeneous field at a location displaced from the coils in the Z dimension the coils are preferably placed in the XY plane. For example, in geological applications where the volume under observation is underground, the coils 10 and 12 would be placed flat on the ground. The magnetic field generated by this coil arrangement is partially illustrated in FIG. 3a. Dotted line 11 in FIG. 3a represents a constant field magnitude line of the field produced by coil 10 alone. Dotted line 13 illustrates a constant field magnitude line generated by coil 12 alone. Magnetic fields are additive in a region. Therefore, the magnetic field produced by coils 10 and 12 is the sum effect of the two separate fields at any location. The shaded area 9 in FIG. 3a represents the magnetically homogeneous region created by the interaction of coils 10 and 12. The dimensions of the homogenous region are dictated by the diameter of the coils 10 and 12 and the magnitude of the current applied to the coils. The homogeneous region of the field is the region where the first and all higher derivatives of the field Ho are zero.

Basically, as the field strength and/or the radius of the coils increases, the depth at which the Ho field remains homogeneous increases. Using conventional materials (non superconductive), and reasonable power requirements and coil sizes, homogenous field regions can be generated at locations over 20 meters from the coils. By using super-conductive materials in the coils, this depth can be greatly increased. The volume of observation should be within the homogeneous region.

Although, FIG. 2a shows the coils 10 and 12 lying on the plane of the earth, it is not necessary that coils 10 and 12 be in the same plane. For instance, coil 10 could be placed at an elevation above coil 12.

It is desirable to be able to distinguish the NMR signal received from different spatial locations in the volume under observation in order to obtain a higher resolution in the volume under observation. As noted earlier, the frequency of resonance of any particular nucleus is dictated by the field strength at the location of that nucleus. Therefore, by applying a field gradient in each of the three coordinate axes, three dimensional spatial information about the distribution of the NMR active nuclei within the volume under observation can be ascertained from the frequency spectrum of the received magnetic field.

Figure 2B:
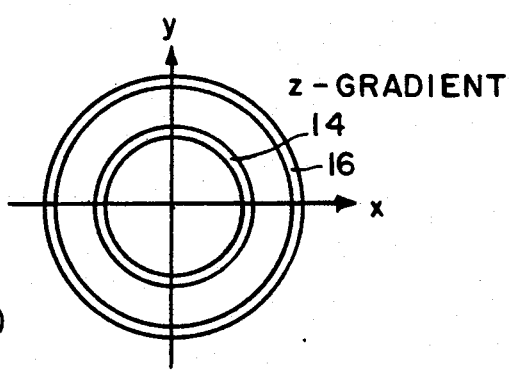
Figure 3B:
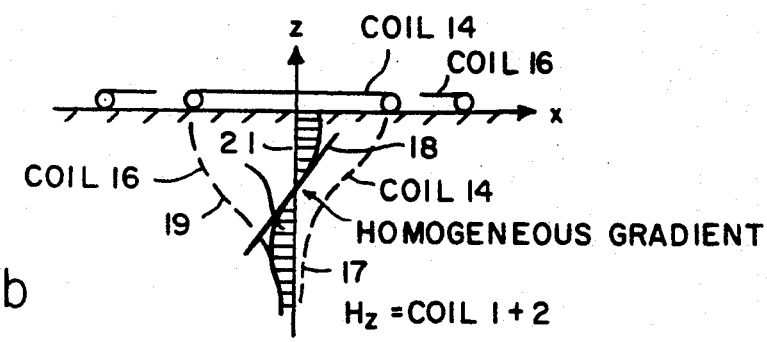

FIG. 2b illustrates an appropriate coil arrangement for generating a Z gradient field on one side of the coil arrangement. The Z gradient coil arrangement comprises two additional concentric annular coils 14 and 16 having current flowing in opposite directions to one another. The Z gradient coil arrangement may be identical to the Ho field coil in structure, however, the electrical current applied to the coils to create the Z gradient field must be of a different magnitude than the Ho electrical field in order to induce a non-homogeneous Z gradient field in the volume under observation as opposed to a homogenous field. Accordingly, the same coil arrangement can be used to create a homogenous or a non homogeneous field at the same location depending on the magnitude of the current flowing through the coils. FIG. 3b partially illustrated the field generated by the Z gradient coils of FIG. 2b. Dotted line 17 illustrates a constant magnetic flux line of the field produced by coil 14 alone. Dotted line 19 illustrates a constant magnetic flux line generated by coil 16 alone. The sum magnetic field of the two coils is illustrated by the shaded area 21. The field is linearly gradient in the Z direction, i.e., the first derivative of the field, $$\frac{dHz}{dz},$$

is a constant near line 18.

A single pair of concentric annular coils may be used to generate both the Ho field and the Z gradient field.

Figure 2C:
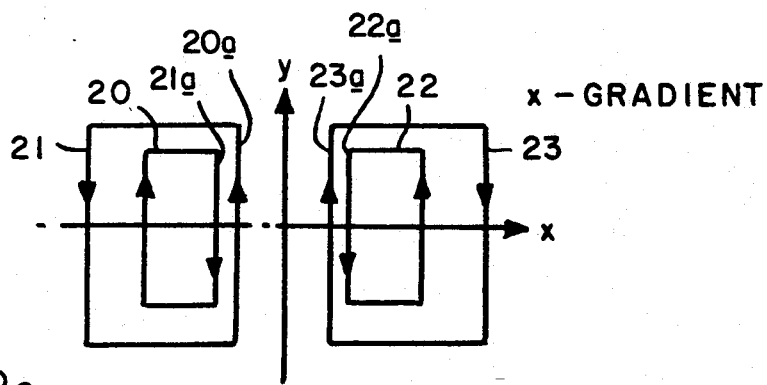

FIG. 2c illustrates a coil configuration for generating a gradient field in the X direction. The same coil configuration, rotated 90°, can be used to generate the gradient in the Y direction. Accordingly, discussion herein will be limited to the X gradient field and it should be understood that it applies equally to a similar coil configuration used to generate the gradient field in the Y direction. The coil configuration comprises two pairs of coplanar (parallel to the XY plane) rectangular coils, comprising coils 20, 21, 22 and 23, laterally displaced from each other in the X direction. All of the coils are aligned with their lengths. e.g., 20a, 21a, 22a, and 23a, perpendicular to the X axis. Each pair of coils comprises a first, larger rectangular coil 31 or 33 and a second, smaller coil 20 or 22 positioned within the larger coil. The smaller coil is not concentric with the larger coil, but is positioned closer to the inside length 21a or 23a of the larger coil 21 or 23. Driving currents are provided to the larger coils such that current flows in their same direction at the inside lengths 21a and 23a. Current is supplied to the smaller coils 20 and 22 such that current flows at their inside lengths 20a or 22a in the opposite direction to the inside length of the corresponding larger coil 21a or 23a, respectively.

Figure 3C:
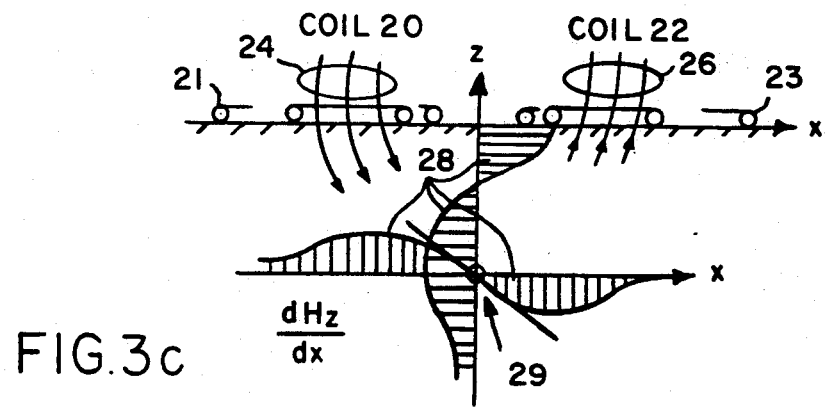

The coils are preferably constructed of copper, silver or aluminum. FIG. 3c shows the net magnetic field created by the interaction of coils 20, 21, 22 and 23. Line 24 illustrates the magnetic flux created by coils 20 and 21 and line 26 illustrates the magnetic flux created by coils 22 and 23. The net magnetic field created by the interaction of the separate magnetic fields of coils 20, 21, 22 and 23 is illustrated by the shaded portion 28. The field gradient is linear in the X direction near line 29. In other words, $$\frac{dHz}{dz}$$

is a constant near line 29 while higher derivatives are made as close to zero as possible.

The interaction of all of the fields created by the two Ho field coils 10 and 12, the two Z gradient coils 14 and 16, the four X gradient coils 20, 21, 22 and 23, and four more Y gradient coils identical to the X gradient coils but rotated 90° in the XY plane, creates a net field H, in the Z direction which is homogeneously gradient in each of the X, Y and Z directions in the volume under observation.

Figure 2D:
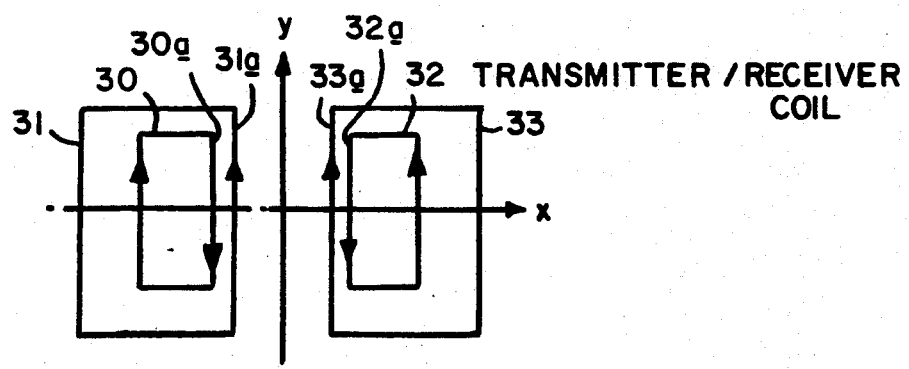
Figure 3D:
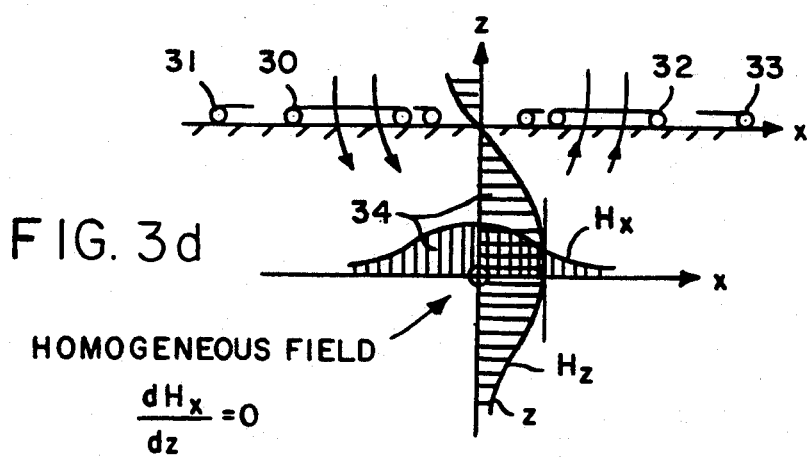

With the Ho field as desired in the volume of interest, it is now necessary to induce a weak RF pulse transverse to the Ho field, i.e., in the XY plane, and monitor (or receive) the resultant NMR signal of the affected nuclei. Since, as discussed earlier, the transmission of the RF pulse and the receiving of NMR information from the volume under observation must be distinct in time, a single set of coils can be used as both the weak RF pulse transmitter coils and the receiver coils. FIG. 2d illustrates a preferred transmitter/receiver coil configuration. Coils 30, 31, 32 and 33 are similar in construction and relative placement to coils 20, 21, 22 and 23 illustrated in FIG. 2c. Further, as illustrated in FIG. 3d, the coils are placed in the XY plane, i.e., the surface of the earth, and an RF electrical pulse is applied to the coils to create the fields illustrated by the shaded area 34 in FIG. 3d.

FIG. 4 is a plan view of one preferred coil arrangement for practicing the present invention. In a geological application, the view of FIG. 4 can be considered a view from the sky looking directly down on an apparatus which is being used to observe a volume beneath the earth. Coils 40 and 42 are used to generate both the Ho field and the Z gradient field. Coils 44, 45, 46 and 47 generate the X gradient field and coils 48, 49, 50 and 51 generate the Y gradient field. Transmitter/receiver coils 52, 53, 54 and 55 are positioned on a plane parallel to the XY plane and are alternately used to generate the RF pulse and then receive the resultant NMR field. Although FIG. 4 is not intended to show scale highly accurately, it should be noted that coils 40 and 42 are likely to be substantially larger than the other coils, as shown, in order to produce a homogeneous field at a substantial distance from the coils.

The various coils need not be in the same XY plane. For instance, the transmitter/receiver coils 52, 53, 54 and 55 may be placed directly above the X gradient coils 44, 45, 46 and 47, respectively. In fact, since coils 40 and 42 will typically be much larger than the other coils, it may be desirable to place all of the other coils either above or below coils 40 and 42 as opposed to on the same plane in order to reduce the surface area occupied by the apparatus. It should also be noted that the shape of the coils disclosed is a preferred embodiment and that any coil arrangement which generates sufficient X, Y and Z gradients and a sufficiently homogeneous Ho field in the volume under observation is acceptable. Even the orientation of the coils may be altered.

Figure 3E:
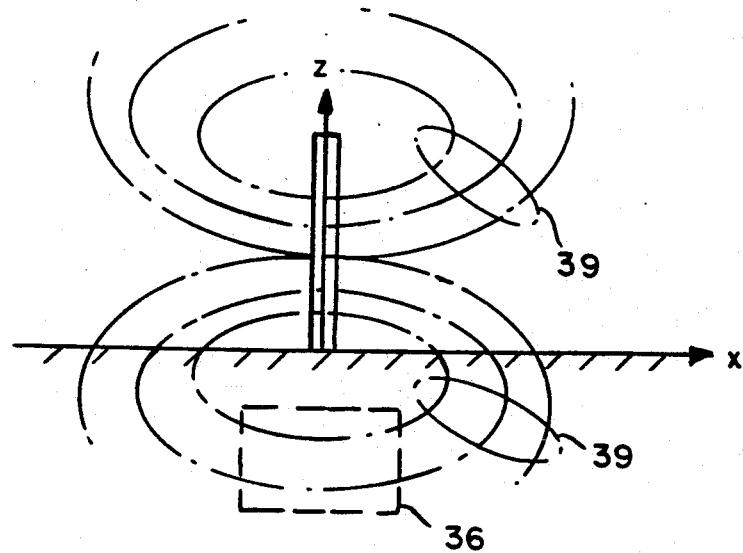

For instance, FIGS. 2e and 3e illustrate at least one other alternate embodiment of coils for producing the homogeneous Ho field. Coils 35 and 37 are concentric annular coils of different size and with current flowing in opposite directions in each coil and are essentially similar to the coils illustrated in FIGS. 2a and 3a except that they are "standing" in a vertical direction as shown in FIG. 2e. FIG. 3e illustrated a magnetic field which can be generated by this configuration. Lines 39 illustrate the constant magnitude field lines created by this coil arrangement. Shaded area 36 shows a volume within which this field is homogeneous. The Ho field created by this coil in configuration is in the X direction. With different scaling of the currents applied in the coils 35 and 37, a similar coil arrangement can also be used to generate the gradient fields or even the excitation field. Other coil arrangements for producing the fields described herein and the means by which the illustrated fields can be generated from these coil arrangements would be obvious to a person of ordinary skill in the related arts.

In operation, the RF pulse is generated and, after a specified interval, the resultant magnetic field picked up at the transmitter/receiver coils 30, 31, 32 and 33 is collected, digitized and stored in computer memory by the NMR imaging equipment. One or more of the gradient fields can then be incremented and the process can be repeated. The process is repeated, with the individual gradient fields being incremented between each collection of data, as many times as necessary to achieve the desired resolution (e.g., 128×128×128). Once the desired number of data points are collected, the received information is then processed according to conventional NMR imaging techniques, including Fourier transformation.

The fields generated by the gradient coils may be altered by simply scaling the current driven therethrough.

Figure 5:
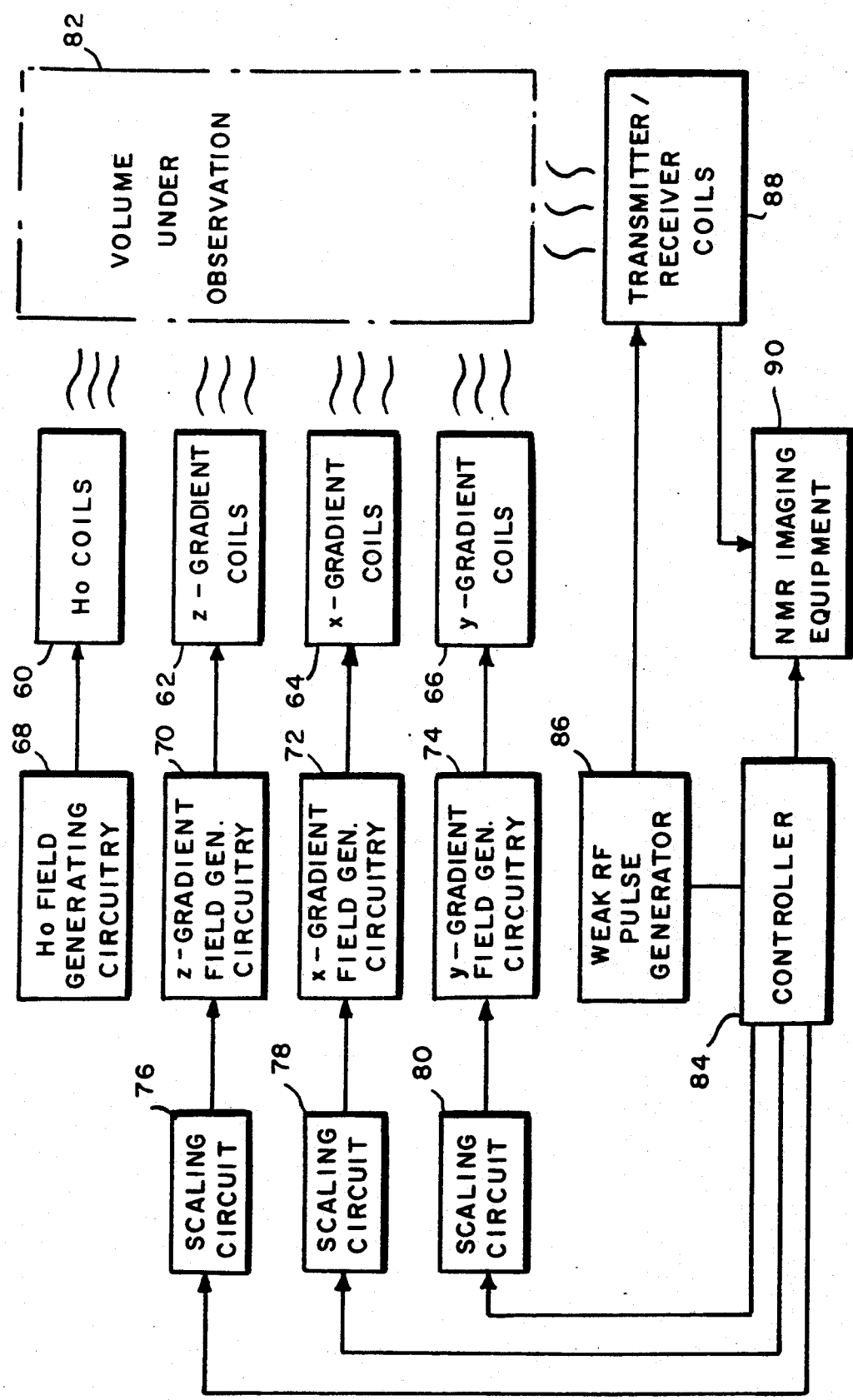
FIG. 5 is generalized block diagram of the components of a preferred embodiment of the present invention.

FIG. 5 illustrates a generalized block diagram of the overall NMR imaging system of the present invention. The Ho coils, Z gradient coils, X gradient coils, and Y gradient coils are shown at 60, 62, 64 and 66 respectively. Power supplies and circuitry are necessary for generating electric current in the coils to produce the desired magnetic field. The power supplies and circuitry for generating the Ho field, Z gradient, X gradient field, and Y gradient field are shown at 68, 70, 72 and 74, respectively. In order to increment the magnitude of the individual gradient fields in the volume under observation, scaling circuits 76, 78 and 80 are provided to adjust the current flow in the coils. The volume under observation is represented by dashed boxed 82. The coils 60, 62, 64 and 66 are magnetically coupled to the volume under observation as previously described. The scaling circuitry 76, 78 and 80 are under computer control of controller 84 to appropriately scale each gradient field at the appropriate time. A weak RF pulse generator 86 is also under computer control to generate the RF pulses at specified time intervals. Transmitter/receiver coils 88 are also magnetically coupled to the volume under observation 82. Coils 88 are coupled both to the RF pulse generator 82 and the NMR imaging equipment 90 since they are used both for producing the excitation field and receiving the resultant NMR field. Alternately, separate coil arrangements may be used for each purpose. The NMR imaging equipment collects, digitizes and stores the received information until the desired number of images are stored. It then performs a Fourier transformation on the collected information and produces a three dimensional image of the volume under observation.

Figure 6:
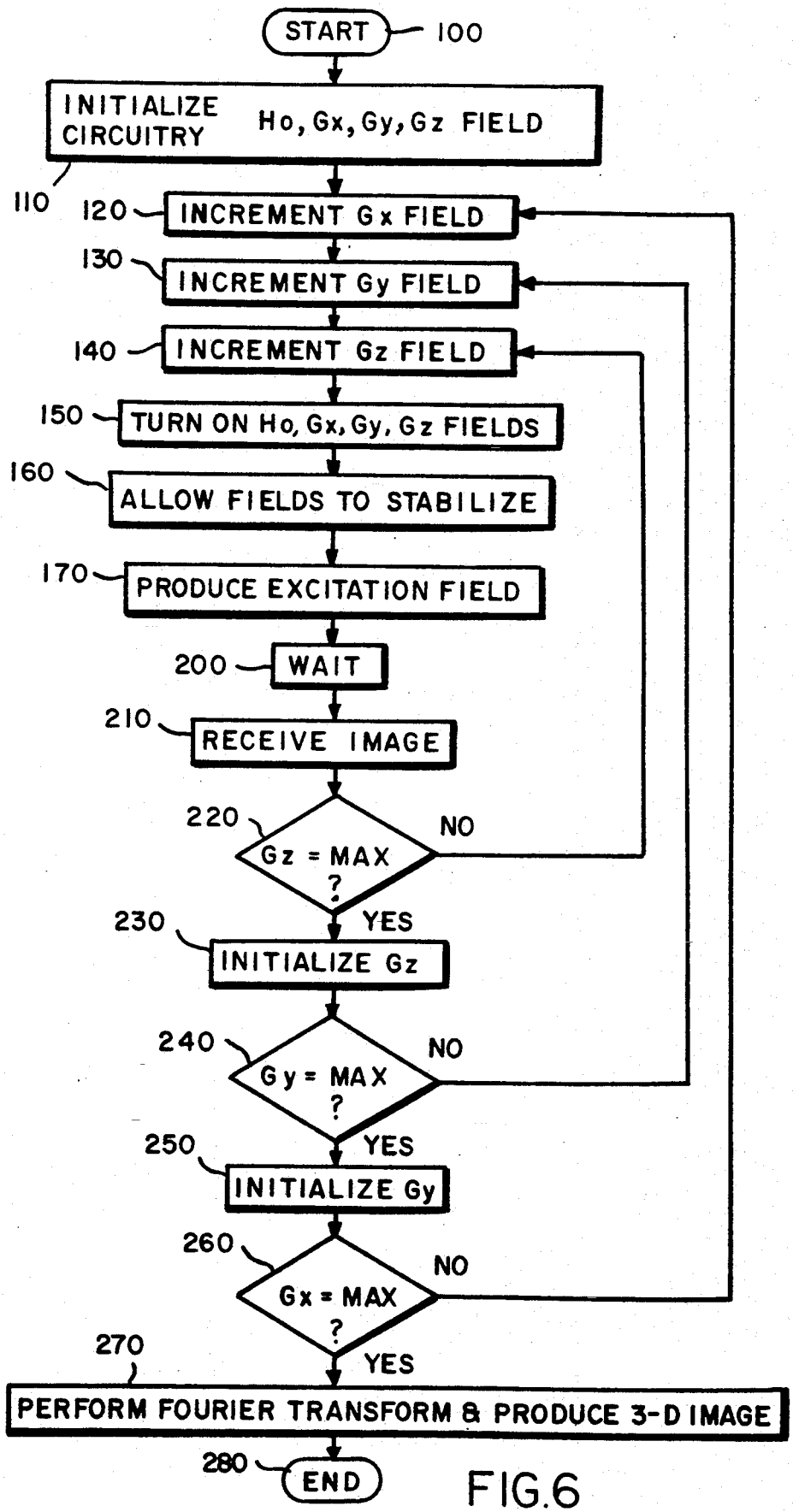
FIG. 6 is a flowchart of a preferred method of practicing the present invention.

FIG. 6 is a flowchart of the above-described preferred method of operation of the present invention. The method is begun at step 100 and, in step 110, the circuits for generating the Ho, $G_x$, $G_y$ and $G_z$ fields are initialized. Then in steps 120, 130 and 140, the $G_x$, $G_y$ and $G_z$ fields, respectively, are incremented. On the first pass though the steps, steps 120, 130 and 140 are essentially part of the initialization procedure wherein the fields are initialized (or incremented) to their first state. On subsequent passes through these steps, the fields will actually be incremented from their previous state. In step 150, the Ho, $G_x$, $G_y$ and $G_z$ fields are switched on. Step 160 provides a time delay which allows the fields to stabilize, then in step 170, the excitation field is produced. After a time delay in step 200, the NMR imaging equipment is turned on to receive the resulting NMR magnetic field. Steps 220, 230, 240, 250 and 260 show the individual incrementing of the fields so as to produce a three dimensional series of images of the volume under observation. For instance, step 220 checks to see if the $G_z$ field has been incremented the desired number of times (max.). If not, flow is returned to step 140 where the $G_z$ field is incremented and the program runs through steps 150 through 210 again. When the $G_z$ field has been incremented the specified number of times, it is initialized again in step 230 and then the $G_y$ field is incremented. Accordingly, steps 220, 230, 240 and 250 cause steps 150–210 to be repeated for the desired number of images, e.g., 128×128×128. After the data from all the images has been received, stored and digitized, a Fourier transformation is performed on the data and a three dimensional image is produced in step 270. The method is then complete at step 280.

The "one sided" NMR imaging method and apparatus of the present invention is particularly useful in locating underground water or other liquid substances. However, its applications are far reaching. For instance, the present invention may be embodied in a surgical bed and used to image portions of the body during surgery. Unlike conventional medical NMR imaging equipment, all of the magnetic coils can be placed on one side of the patient (beneath him/her). In a conventional medical NMR imaging apparatus, magnetic coils must be disposed on all sides of the patient, which is impractical during surgery as it would severely limit the surgeon's access to the patient.

To obtain NMR information of a volume of interest larger than the homogeneous field region of the particular apparatus, the apparatus can take an image of a given volume under observation and then be moved to another location adjacent to the first location to map the adjacent volume. The apparatus can be moved as many times as necessary to observe the entire desired volume.

In an alternate embodiment, the earth's magnetic field may be used as the Ho field.

Having thus described a few embodiments of the invention, various alterations, modifications and improvements will readily occur to those skilled in the art. Such alterations, modifications and improvements as are made obvious to this disclosure are intended to be part of this description though not expressly stated herein, and are intended to be within the spirit and scope of the invention. Accordingly, the foregoing description is by way of example only, and not limiting. The invention is limited only as defined in the following claims and equivalence thereto.

What is claimed is:

1. A one sided nuclear magnetic resonance (NMR) imaging apparatus for imaging a volume under observation which is located on a first side of a planar boundary, comprising;
   means for producing a first magnetic field in a first direction which is homogeneous in said volume under observation,
   means located on a second side of said planar boundary for producing a second magnetic field which, at said volume under observation, is linearly gradient in at least one direction,
   excitation means located on said second side of said planar boundary for producing a magnetic field in said volume under observation in a direction transverse to said first direction, which field induces NMR of at least one select type of atomic nucleus,
   means located on said second side of said planar boundary for receiving a magnetic field signal created by said NMR, and
   means for NMR imaging the received magnetic field signal.

2. An apparatus as set forth in claim 1 wherein said means for producing said first magnetic field comprises the earth's magnetic field.

3. An apparatus as set forth in claim 1 wherein said means for producing said first magnetic field comprises coil means located on said second side of said planar boundary.

4. An apparatus as set forth in claim 1 wherein said excitation means comprises means for producing a magnetic pulse comprising one of the group of an RF pulse, a DC pulse, a continuous wave pulse and an adiabatic pulse.

5. An apparatus as set forth in claim 3 further comprising,
   means for incrementing the magnitude of said second magnetic field.

6. An apparatus as set forth in claim 3 wherein said means for producing said second magnetic field comprises means for producing a linearly gradient field in each of three orthogonal directions, wherein a first one of said orthogonal directions is said first direction.

7. An apparatus as set forth in claim 6 wherein said means for incrementing comprises means for incrementing the magnitude of said second magnetic field in each of said three orthogonal directions.

8. An apparatus as set forth in claim 7 further comprising means for storing the magnetic field signal received at said receiving means.

9. An apparatus as set forth in claim 8 wherein said means for producing said first magnetic field and said means for producing said second magnetic field each comprise magnetic coil arrangements.

10. An apparatus as set forth in claim 9 wherein said means for producing said first magnetic field comprises first and second concentric, annular coils disposed with their radial axis parallel to said first direction and wherein said first coil has a smaller radius than said second coil, and
   first circuit means coupled to said first and second annular coils for generating a current in said coils which will produce said homogeneous magnetic field in said volume under observation.

11. An apparatus as set forth in claim 10 wherein said first and second annular coils are coplanar.

12. An apparatus as set forth in claim 11 wherein said means for producing said second magnetic field comprises,
   a pair of concentric, annular coils disposed with their radial axis parallel to said first direction and wherein one of said coils has a smaller radius than the other of said coils for producing said linear gradient in said first direction, and
   second circuit means coupled to said pair of annular coils for generating a current in said coils which will produce a linearly gradient magnetic field in said first direction in said volume under observation.

13. An apparatus as set forth in claim 12 wherein said pair of concentric, annular coils of said means for producing said second magnetic field are said first and second coils of said means for producing said first magnetic field.

14. An apparatus as set forth in claim 13 wherein said means for producing said second magnetic field further comprises, first and second pairs of rectangular coils, each of said pairs comprising a first smaller coil and a second larger coil wherein said smaller coil is located within said larger coil and wherein said coils are oriented with all of their lengths parallel to each other and perpendicular to a second one of said orthogonal directions, said first and second pairs of coils displaced from each other in said second orthogonal direction, third circuit means coupled to said first and second coil pairs for generating an electrical current in said coils for producing a linearly gradient magnetic field in said volume under observation in said second orthogonal direction, third and fourth pairs of rectangular coils, each of said pairs comprising a first smaller coil and a second larger coil wherein said smaller coil is located within said larger coil and wherein said coils are oriented with all of their lengths parallel to each other and perpendicular to a third one of said orthogonal directions, said first and second pairs of coils displaced from each other in said third orthogonal direction, fourth circuit means coupled to said third and fourth coils for generating an electrical current in said coils for producing a linearly gradient magnetic field in said volume under observation in said third orthogonal direction.

15. An apparatus as set forth in claim 14 wherein said receiver means comprises, fifth and sixth pairs of rectangular coils, each of said pairs comprising a first smaller coil and a second larger coil wherein said smaller coil is located within said larger coil and wherein said coils are oriented with all of their lengths parallel to each other and said coils are oriented transverse said first orthogonal direction, said fifth and sixth pairs of coils displaced from each other along a line which is perpendicular to said lengths of said coils.

16. An apparatus a set forth in claim 15 wherein said perturbing means comprises fifth circuit means for generating an RF current pulse in said fifth and sixth coils.

17. A one sided nuclear magnetic resonance (NMR) imaging apparatus for imaging a volume under observation which is located on a first side of a planar boundary, comprising:

means for producing a first magnetic field in a first direction which is homogeneous at said volume under observation, means located on a second side of said planar boundary for producing a second magnetic field which, at said volume under observation, is linearly gradient in at least one direction, excitation means located on said second side of said planar boundary for producing a magnetic field in said volume under observation, which field induces NMR of at least one select type of NMR active nucleus, and means located on said second side of said planar boundary for receiving a magnetic field signal created by said NMR, wherein said means for producing said first magnetic field comprises first and second pairs of rectangular coils, each of said pairs comprising a first smaller coil and a second larger coil said smaller coil located within said larger coil and wherein said coils are oriented with all of their lengths parallel to each other and perpendicular to a second one of said orthogonal directions, said first and second pairs of coils displaced from each other in said second orthogonal direction.

18. An apparatus as set forth in claim 17 wherein said smaller coil of each coil pair is offset from the center of the corresponding larger coil towards the direction of the other coil pair.

19. An apparatus as set forth in claim 18 further comprising circuit means coupled to said first and second coil pairs for causing current to flow in a clockwise direction in said smaller coil of said first pair of rectangular coils and in said larger coil of said second pair of rectangular coils and causing current to flow in a counterclockwise direction in said larger coil of said first pair of rectangular coils and said smaller coil of said second pair of rectangular coils so as to produce a linearly gradient magnetic field in said volume under observation in said second orthogonal direction.

20. An apparatus as set forth in claim 19 wherein said means for producing said second magnetic field comprises two set of said first and second pairs of rectangular coils oriented in a plane and rotated 90° from each other.

21. An apparatus as set forth in claim 20 wherein said means for producing said second magnetic field further comprises first and second concentric annular coils disposed with their radial axes parallel to a third of said three orthogonal directions and wherein said first coil has a smaller radius than said second coil.

22. An apparatus as set forth in claim 21 wherein said means for producing said second magnetic field further comprises circuit means coupled to said first and second annular coils so as to produce a linearly gradient magnetic field in said third direction in said volume under observation.

23. A method for performing one sided nuclear magnetic resonance (NMR) imaging of a volume under observation which is located on a first side of a planar boundary, comprising;

(1) producing a first magnetic field in a first direction from a location on a second side of said planar boundary which is homogeneous at said volume under observation on said first side of said planar boundary, (2) producing a second magnetic field from a location on a second side of said planar boundary which, at said volume under observation, is linearly gradient in at least one direction (3) from a location on said second side of said planar boundary, producing a magnetic field in said volume under observation in a direction transverse to said first direction, which field induces NMR of at least one select type of atomic nucleus, (4) receiving a magnetic field signal created by said NMR on said second side of said planar boundary, and (5) NMR imaging the received magnetic field signal.

24. A method as set forth in claim 23 further comprising the steps of,
 (6) incrementing the magnitude of said second magnetic field, and
 (7) repeating steps (4) through (6).

25. A method as set forth in claim 24 further comprising the step of waiting for said second magnetic field to stabilize between steps (2) and (3).

26. A method as set forth in claim 25 further comprising the step of waiting a predetermined period between steps (3) and (4).

27. A method as set forth in claim 23 wherein said second magnetic field is linearly gradient in each of three orthogonal directions, wherein a first one of said orthogonal directions is said first direction.

28. A method as set forth in claim 27 further comprising step (6) comprises the steps of individually incrementing the magnitude of said second magnetic field in each of said three orthogonal axes to produce a three dimensional incrementation matrix.

29. A method as st forth in claim 28 wherein said step of NMR imaging comprises the step of generating a Fourier transformation of said received magnetic fields and producing a three dimensional image of said volume under observation.

* * * * *